United States Patent
Lee et al.

(10) Patent No.: US 7,816,778 B2
(45) Date of Patent: Oct. 19, 2010

(54) PACKAGED IC DEVICE COMPRISING AN EMBEDDED FLEX CIRCUIT ON LEADFRAME, AND METHODS OF MAKING SAME

(75) Inventors: Choon Kuan Lee, Singapore (SG); Chong Chin Hui, Singapore (SG); David J. Corisis, Nampa, ID (US)

(73) Assignee: Micron Technology, Inc., Boise, ID (US)

( * ) Notice: Subject to any disclaimer, the term of this patent is extended or adjusted under 35 U.S.C. 154(b) by 442 days.

(21) Appl. No.: 11/676,578

(22) Filed: Feb. 20, 2007

(65) Prior Publication Data

US 2008/0197460 A1 Aug. 21, 2008

(51) Int. Cl.
H01L 23/48 (2006.01)
H01L 23/52 (2006.01)
H01L 29/40 (2006.01)

(52) U.S. Cl. .................. 257/688; 257/666; 257/670; 257/672; 257/676; 257/678; 257/686; 257/690; 257/693; 257/700; 257/723; 257/724; 257/777; 257/778; 257/E23.01; 257/E23.031; 257/E23.055; 257/E23.065; 257/E23.078; 257/E25.003; 257/E25.006

(58) Field of Classification Search .................. 257/678, 257/670, 686, 688, 666, 672, 676, 690, 693, 257/700, 723, 724, 777, 778, E23.01, E23.031, 257/23.055, E23.065, E23.078, E25.003, 257/E25.006
See application file for complete search history.

(56) References Cited

U.S. PATENT DOCUMENTS 3,544,857 A 12/1970 Byrne et al.
3,793,714 A * 2/1974 Bylander .................. 29/827
3,961,413 A 6/1976 Noe
5,332,864 A * 7/1994 Liang et al. ............... 174/523
5,539,251 A * 7/1996 Iverson et al. ............. 257/670
5,793,101 A * 8/1998 Kuhn ........................ 257/676
6,162,662 A 12/2000 Corisis ...................... 438/111
6,303,985 B1 10/2001 Larson et al. .............. 257/676
6,577,019 B1 6/2003 Roberts et al. ............. 257/797

(Continued)

FOREIGN PATENT DOCUMENTS

EP 1306900 5/2003

OTHER PUBLICATIONS

International Search Report and Written Opinion for Application No. PCT/US2008/051873.

*Primary Examiner*—Fernando L Toledo
*Assistant Examiner*—John P Dulka
(74) *Attorney, Agent, or Firm*—Perkins Coie LLP

(57) ABSTRACT

A device is disclosed which includes a flexible material including at least one conductive wiring trace, a first die including at least an integrated circuit, the first die being positioned above a portion of the flexible material, and an encapsulant material that covers the first die and at least a portion of the flexible material. A method is disclosed which includes positioning a first die above a portion of a flexible material, the first die including an integrated circuit and the flexible material including at least one conductive wiring trace, and forming an encapsulant material that covers the first die and at least a portion of the flexible material, wherein at least a portion of the flexible material extends beyond the encapsulant material.

19 Claims, 12 Drawing Sheets

U.S. PATENT DOCUMENTS

| | | |
|---|---|---|
| 6,683,377 B1 | 1/2004 | Shim et al. |
| 6,930,240 B1 | 8/2005 | Giboney et al. ............ 174/35 C |
| 7,057,116 B2 * | 6/2006 | Reid et al. .................. 174/260 |
| 7,154,171 B1 * | 12/2006 | Yoshida ...................... 257/688 |
| 7,161,237 B2 | 1/2007 | Lee ............................ 257/698 |
| 2002/0030975 A1 | 3/2002 | Moon |
| 2003/0164551 A1 | 9/2003 | Lee et al. .................... 257/778 |
| 2004/0089933 A1 * | 5/2004 | Haque et al. ................. 257/686 |
| 2004/0150088 A1 | 8/2004 | Corisis ....................... 257/684 |
| 2005/0214963 A1 * | 9/2005 | Daniels et al. ................ 438/29 |
| 2008/0054488 A1 * | 3/2008 | Leddige et al. .............. 257/777 |

* cited by examiner

PACKAGED IC DEVICE COMPRISING AN EMBEDDED FLEX CIRCUIT ON LEADFRAME, AND METHODS OF MAKING SAME

BACKGROUND OF THE INVENTION

1. Technical Field

This subject matter disclosed herein is generally directed to the field of packaging of integrated circuit devices, and, more particularly, to a packed IC device comprising an embedded flex circuit and various methods of making same.

2. Description of the Related Art

Integrated circuit technology uses electrical devices, e.g., transistors, resistors, capacitors, etc., to formulate vast arrays of functional circuits. The complexity of these circuits requires the use of an ever-increasing number of linked electrical devices so that the circuit may perform its intended function. As the number of transistors increases, the integrated circuitry dimensions shrink. One challenge in the semiconductor industry is to develop improved methods for electrically connecting and packaging circuit devices which are fabricated on the same and/or on different wafers or chips. In general, it is desirable in the semiconductor industry to construct transistors which occupy less surface area on the silicon chip/die.

In the manufacture of semiconductor device assemblies, a single semiconductor die is most commonly incorporated into each sealed package. Many different package styles are used, including dual inline packages (DIP), zig-zag inline packages (ZIP), small outline J-bends (SOJ), thin small outline packages (TSOP), plastic leaded chip carriers (PLCC), small outline integrated circuits (SOIC), plastic quad flat packs (PQFP) and interdigitated leadframe (IDF). Some semiconductor device assemblies are connected to a substrate, such as a circuit board, prior to encapsulation. Manufacturers are under constant pressure to reduce the size of the packaged integrated circuit device and to increase the packaging density in packaging integrated circuit devices.

The assembly of a semiconductor device and a leadframe and die ordinarily includes bonding of the die to a paddle of the leadframe, and wire bonding the bond pads on the die to the inner leads, i.e., lead fingers, of the leadframe. The inner leads, semiconductor die and bond wires are then encapsulated, and extraneous parts of the leadframe excised. In one illustrative example, the leadframe strip comprises a thin metal foil that is configured for the mounting of one or more semiconductor die, e.g., one on each die mount paddle. The leadframe strip also includes parallel spaced side rails formed with a pattern of registry holes to facilitate handling by automatic machinery. In addition, the leadframe strip includes an arrangement of inner leads configured for attachment to the bond pads of the semiconductor die during a wire bonding step. The outer leads of the leadframe strip function as the external leads of the completed semiconductor device package for connection to an external device or structure, e.g., a circuit board. The leads are connected to the side rails by dam bars, and supported thereby. The die mount paddles are typically connected to each of the side rails by a paddle support bar, extending transversely with respect to the centerline of the leadframe strip.

Such traditional packaging techniques and arrangements may not be able to meet the demands for more densely packaged integrated circuit devices desired by semiconductor manufacturers and their customers.

BRIEF DESCRIPTION OF THE DRAWINGS

The invention may be understood by reference to the following description taken in conjunction with the accompanying drawings, in which like reference numerals identify like elements, and in which.

Figure 1:
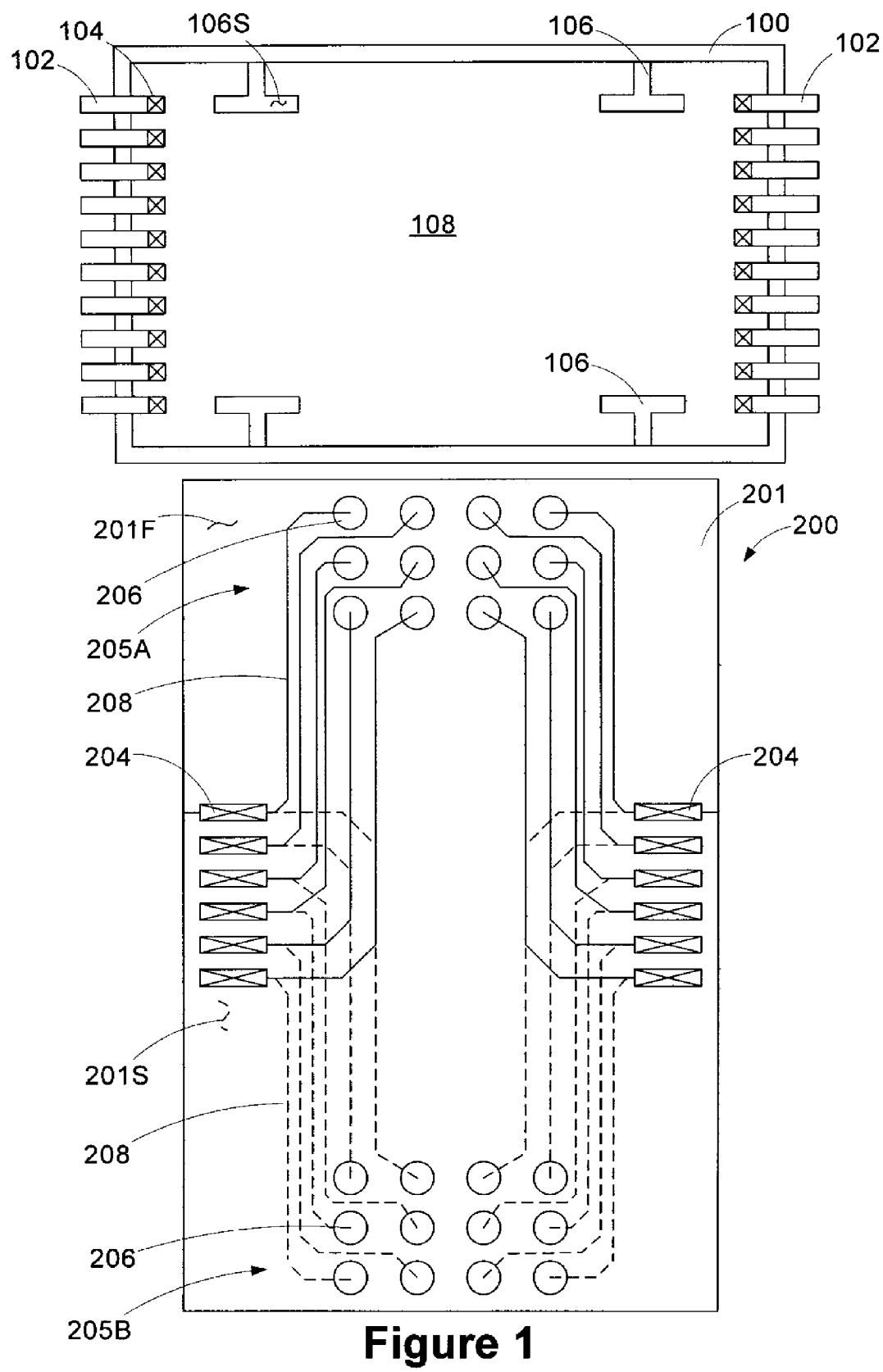
FIGS. 1-13 are various views of an illustrative packaged integrated circuit device that includes a leadframe and flex circuit that may be employed as described herein.

While the subject matter disclosed herein is susceptible to various modifications and alternative forms, specific embodiments thereof have been shown by way of example in the drawings and are herein described in detail. It should be understood, however, that the description herein of specific embodiments is not intended to limit the invention to the particular forms disclosed, but on the contrary, the intention is to cover all modifications, equivalents, and alternatives falling within the spirit and scope of the invention as defined by the appended claims.

DETAILED DESCRIPTION OF THE INVENTION

Illustrative embodiments of the invention are described below. In the interest of clarity, not all features of an actual implementation are described in this specification. It will of course be appreciated that in the development of any such actual embodiment, numerous implementation-specific decisions must be made to achieve the developers' specific goals, such as compliance with system-related and business-related constraints, which will vary from one implementation to another. Moreover, it will be appreciated that such a development effort might be complex and time-consuming, but would nevertheless be a routine undertaking for those of ordinary skill in the art having the benefit of this disclosure.

Although various regions and structures shown in the drawings are depicted as having very precise, sharp configurations and profiles, those skilled in the art recognize that, in reality, these regions and structures are not as precise as indicated in the drawings. Additionally, the relative sizes of the various features and doped regions depicted in the drawings may be exaggerated or reduced as compared to the size of those features or regions on fabricated devices. Nevertheless, the attached drawings are included to describe and explain illustrative examples of the subject matter disclosed herein.

Figure 2:
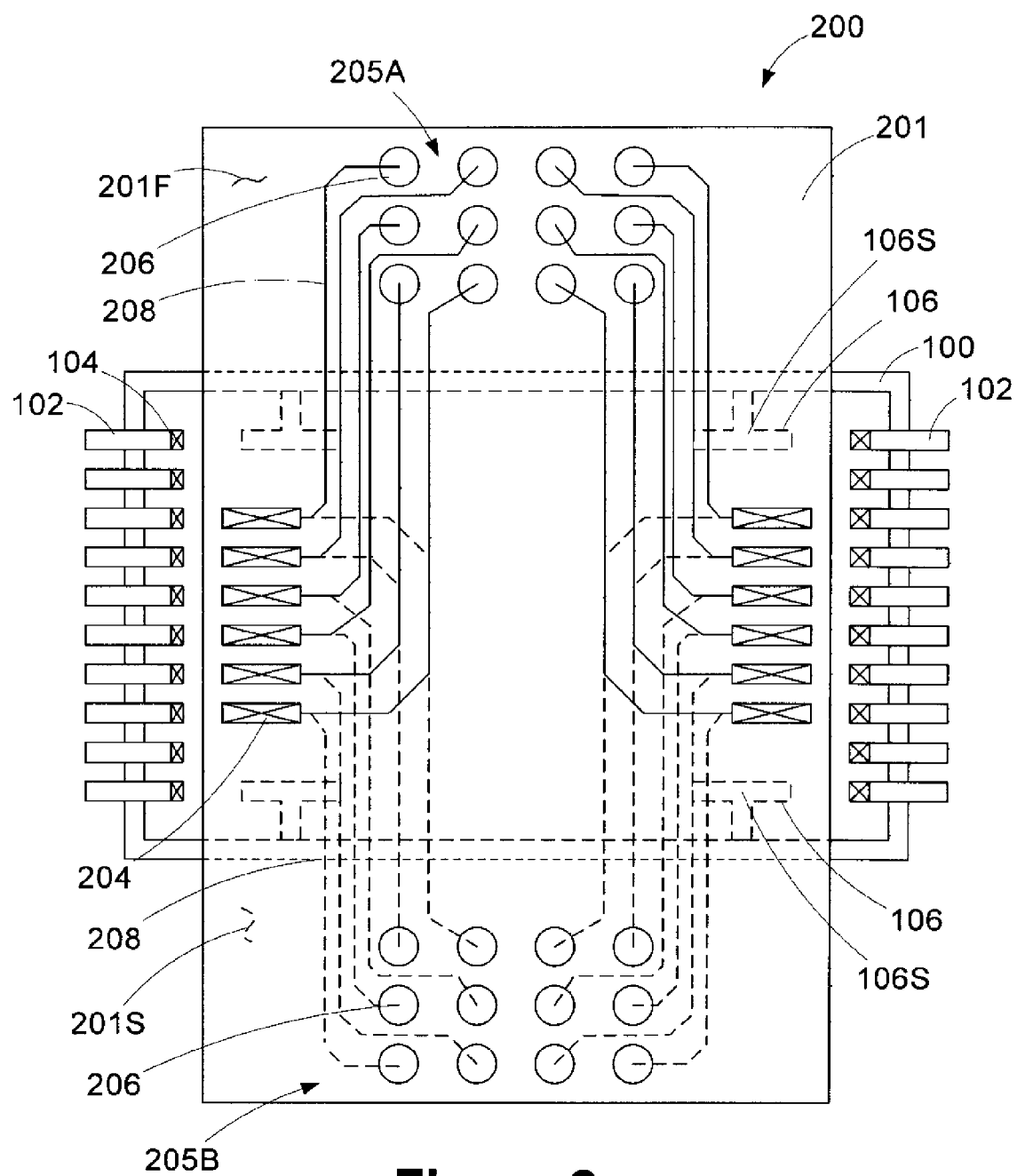
Figure 3:
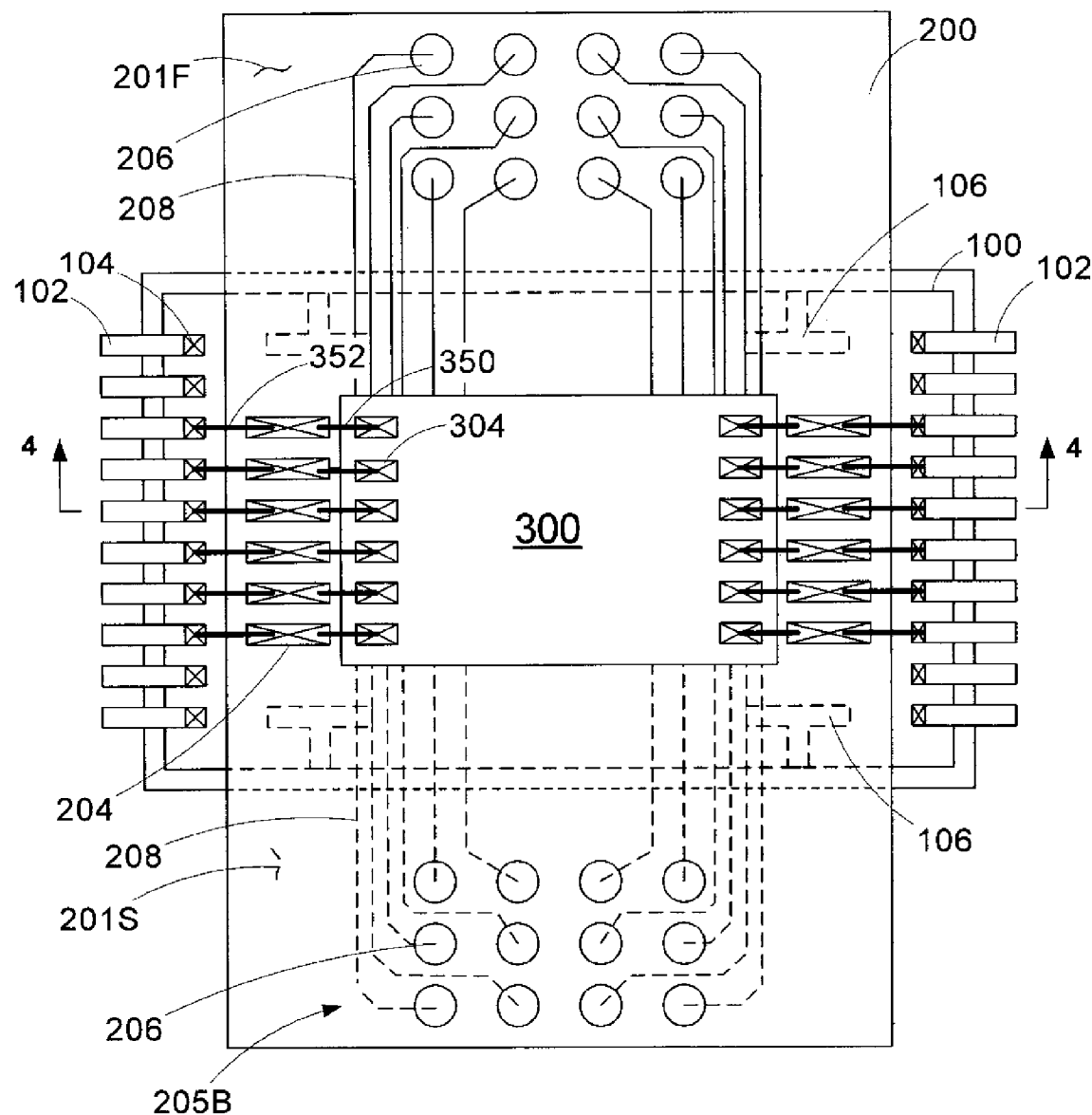

FIGS. 1-3 are top views depicting an illustrative leadframe 100 and flex circuit 200 that may be employed for the purposes described herein. The schematically depicted leadframe 100 shown in FIGS. 1-3 is intended to be representative of any of a variety of different types of leadframe structures that are employed in packaging integrated circuit devices. In general, the leadframe 100 comprises a plurality of lead fingers 102 with illustrative bond pads 104 formed thereon. The exact number and arrangement of the lead fingers 102 may vary depending upon the particular application. The leadframe 100 also comprises a plurality of structures 106, e.g., tie bars, dam bars, that, as described more fully below, may be employed in coupling the flex circuit 200 to the leadframe 100. In the depicted embodiment, the structures 106 have a surface 106S that may be positioned in approximately the same plane as that of the lead fingers 102. Notably, in the disclosed example, the leadframe 100 does not employ a paddle or die support structure in the interior region 108 of the leadframe 100. However, the present disclosure should not be considered as limited to the illustrative arrangement depicted in FIG. 1 in which the interior region 108 is substantially free of any structure.

The schematically depicted flex circuit 200 is also intended to be representative of any of a variety of different flex circuit devices or materials that are commonly employed in the packaging or manufacture of integrated circuit devices or products incorporating such devices. The illustrative flex circuit 200 comprises a body 201 having a first surface 201F and a second surface 201S that are on opposite sides of the flex circuit 200. The flex circuit 200 further comprises a plurality of illustrative bond pads 204 and a plurality of electrical connector arrays 205A, 205B that are formed on opposite ends of the flex circuit 200. Each of the illustrative arrays 205A comprise a plurality of electrical connectors 206. In one illustrative example, the arrays 205 define a ball grid array assembly that is well known to those skilled in the art. Electrical connection between the bond pads 204 and an array 205 may be provided by a plurality of conductive traces 208 formed in or on the body 201 of the flex circuit 200. The arrays 205 are provided such that one or more integrated circuit devices (not shown in FIG. 2) may be conductively coupled to the flex circuit 200, as described more fully below. Of course, the exact number, position, arrangement and layout of the arrays 205 on the flex circuit 200 may vary depending upon the particular application. In a general sense, the illustrative flex circuit 200 is a relatively flexible material that comprises at least one conductive wiring trace.

As shown in FIG. 2, the flex circuit 200 is positioned above and mechanically coupled to the leadframe 100. In the illustrative example depicted herein, the flex circuit 200 may be mechanically coupled to the leadframe 100 by an adhesive material (not shown) that may be applied to the surfaces 106S of the structures 106. Of course, it should be understood that the structures 106 are intended to be representative in nature in that the flex circuit 200 may be mechanically coupled to any portion of the leadframe 100 using any of a variety of known techniques. It should also be understood that, when it is stated herein that a device or structure may be mechanically coupled or electrically coupled to another device or structure, the coupling may be accomplished by direct contact between the coupled components or one or more intermediate structures, circuits or devices may be employed to mechanically or electrically couple the components to one another.

Figure 4:
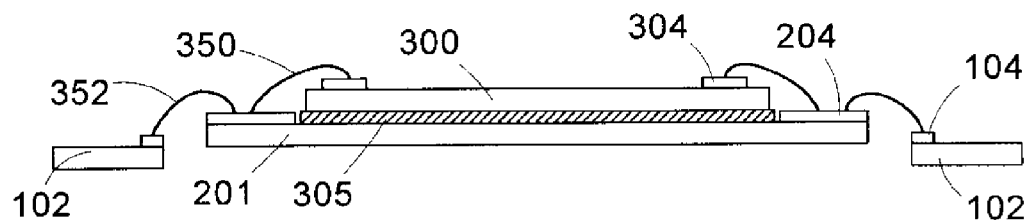

As shown in FIG. 3, an integrated circuit device 300 is positioned above and operatively coupled to the flex circuit 200. In one illustrative example, the integrated circuit device 300 is mechanically coupled to the flex circuit 200 using an adhesive material 305 (see FIG. 4). Of course, the integrated circuit device 300 may be mechanically coupled to the flex circuit 200 using any of a variety of known techniques, e.g., tape, epoxy, etc. The illustrative integrated circuit device 300 comprises a plurality of illustrative bond pads 304 that may be employed to electrically or conductively couple the integrated circuit device 300 to other integrated circuits or devices. Traditional bonding wires 350, 352 may be employed to electrically or conductively couple the illustrative bond pads 304, 204 and 104 using any of a variety of known techniques. The integrated circuit device 300 depicted herein is intended to be representative in nature. That is, the techniques and structures disclosed herein may be employed in situations where the integrated circuit device 300 comprises any of a variety of different types of integrated circuit devices, e.g., a memory device, a logic device, a microprocessor, an application specific integrated circuit, etc.

Figure 6:
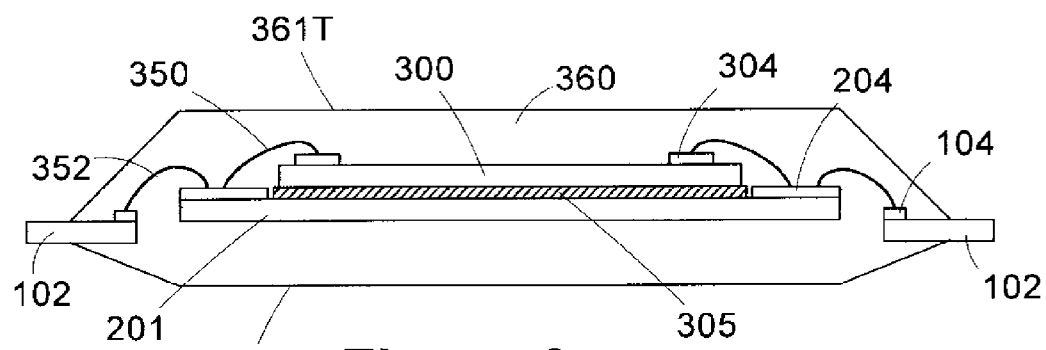
Figure 7:
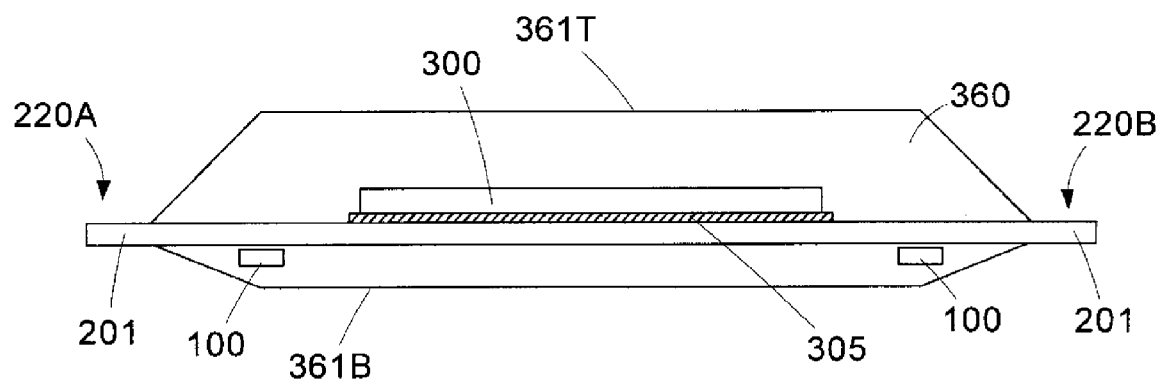
Figure 5:
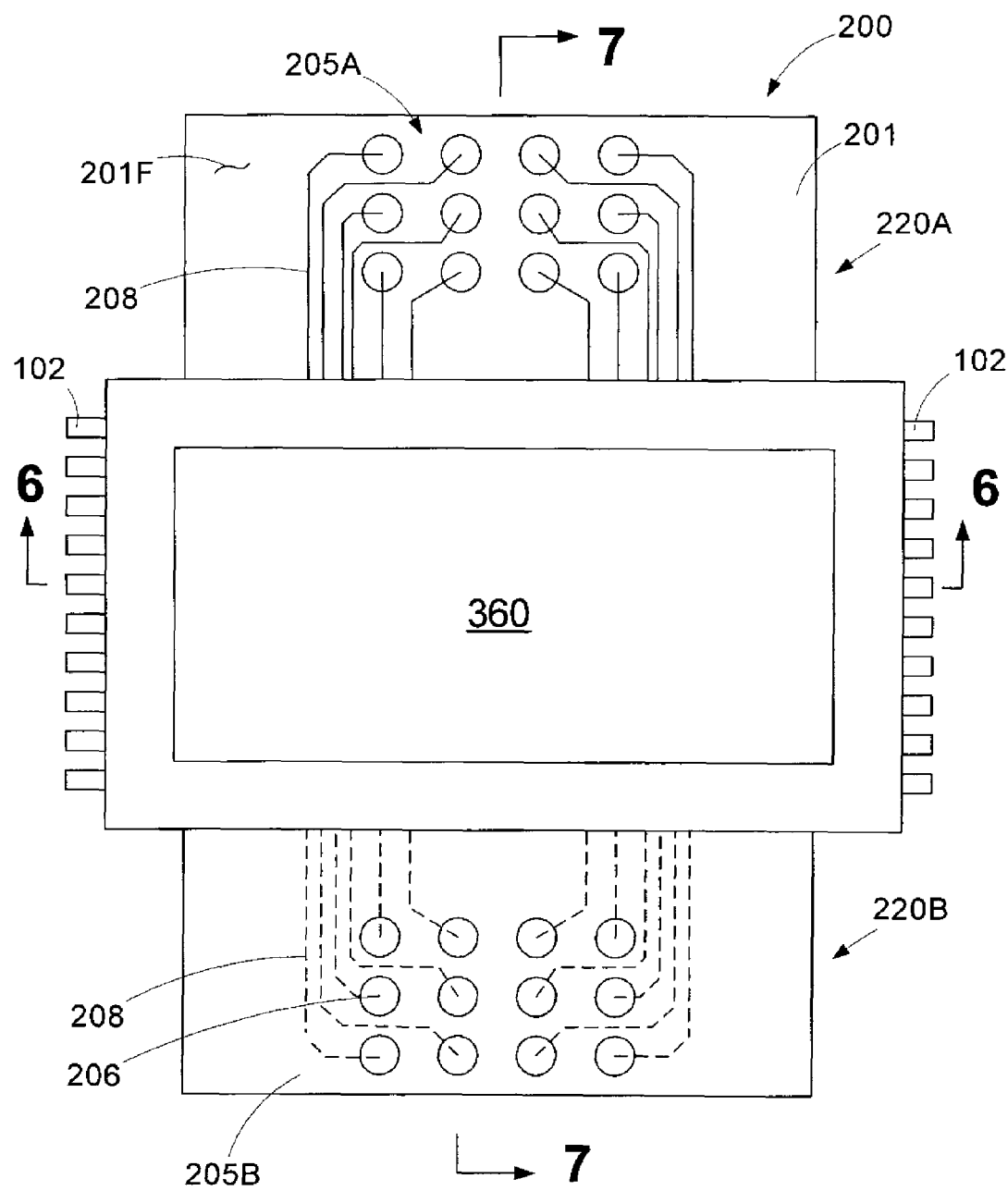
Figure 12:
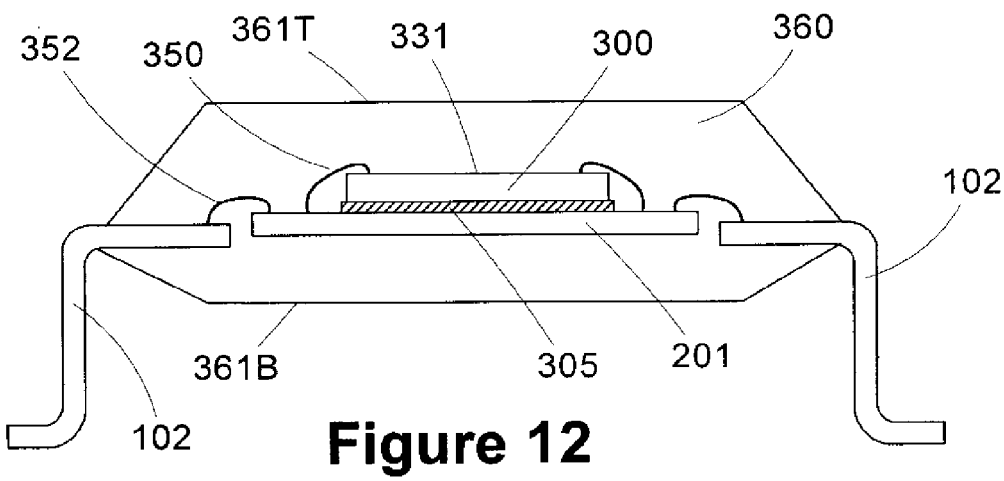
Figure 13:
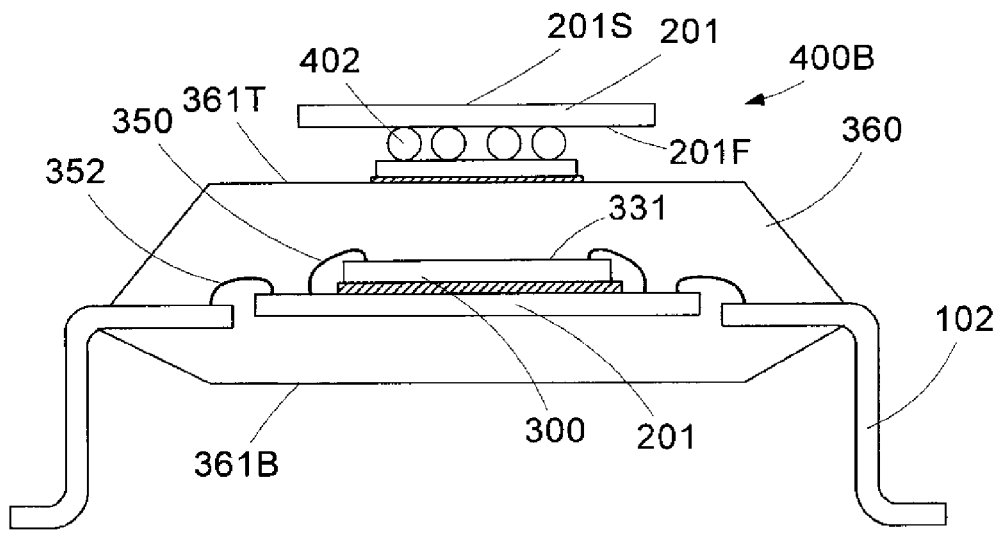

Next, as shown in FIGS. 5-7, an encapsulant material 360 is formed in accordance with known techniques. The encapsulant material 360 covers the die 300 and portions of the flex circuit 200. The encapsulant material 360 may be a mold compound, an epoxy, etc. The encapsulant material 360 has a first outer or top surface 361T and a second outer or bottom surface 361B. A first outer surface 331 of the die 300 is also depicted in FIGS. 12-13. One of the purposes of the encapsulant material 360 is to protect the integrated circuit device 300 and the associated electrical components connected to the device 300 from environmental or structural damage. As can be seen in FIGS. 5 and 7, portions of the flex circuit 200 extend beyond the encapsulant material 360. For reference purposes, these portions are labeled as 220A and 220B. In the illustrative embodiment depicted herein, the portions 220A, 220B of the circuit 200 extending beyond the encapsulant material 360 are approximately symmetrical. However, as will be recognized by those skilled in the art after a complete reading of the present application, the portions 220A, 220B may be symmetrical or there may be only a single portion of the flex circuit 200 that extends beyond the encapsulant material.

Figure 8:
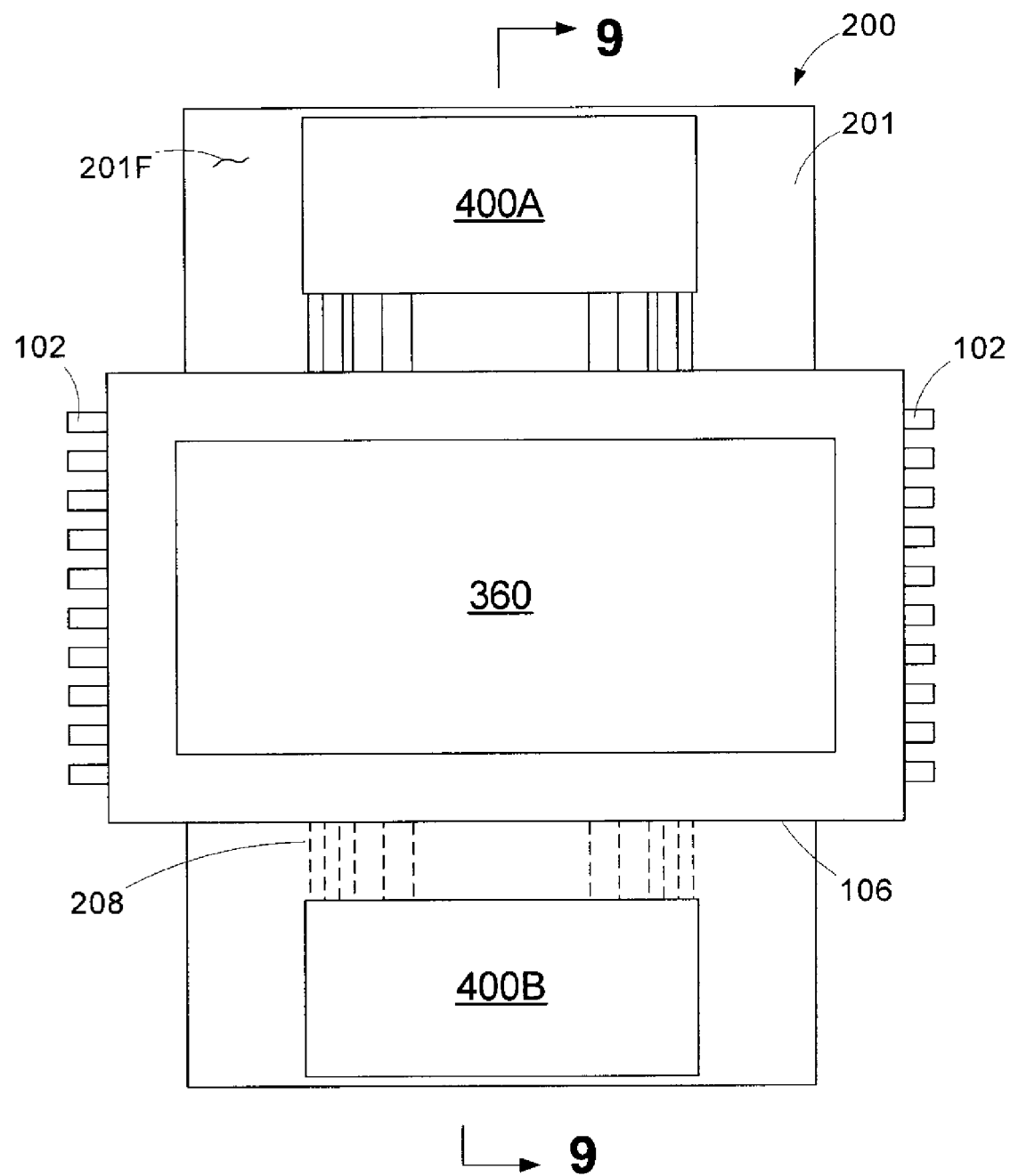
Figure 9:
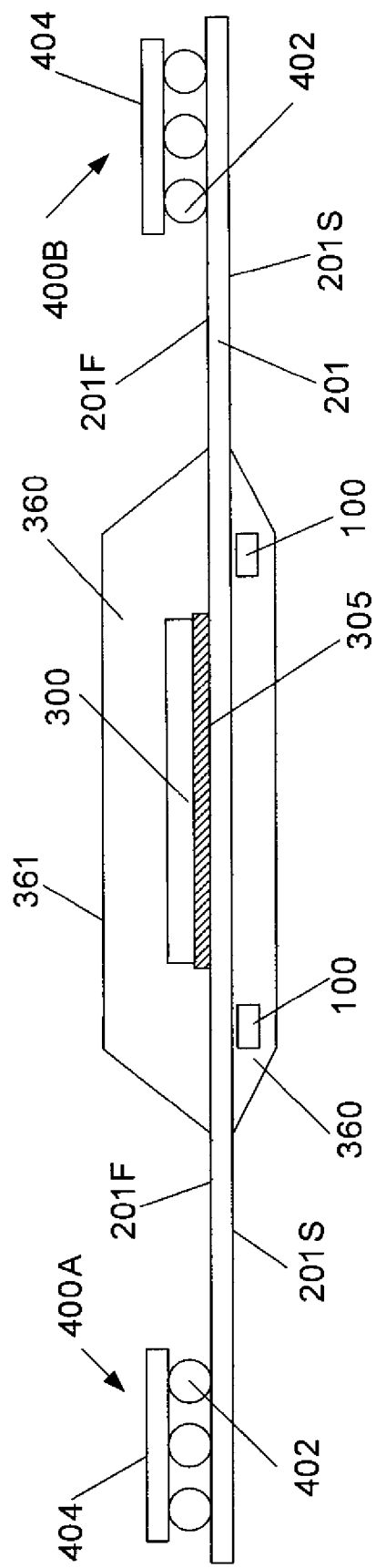
Figure 10:
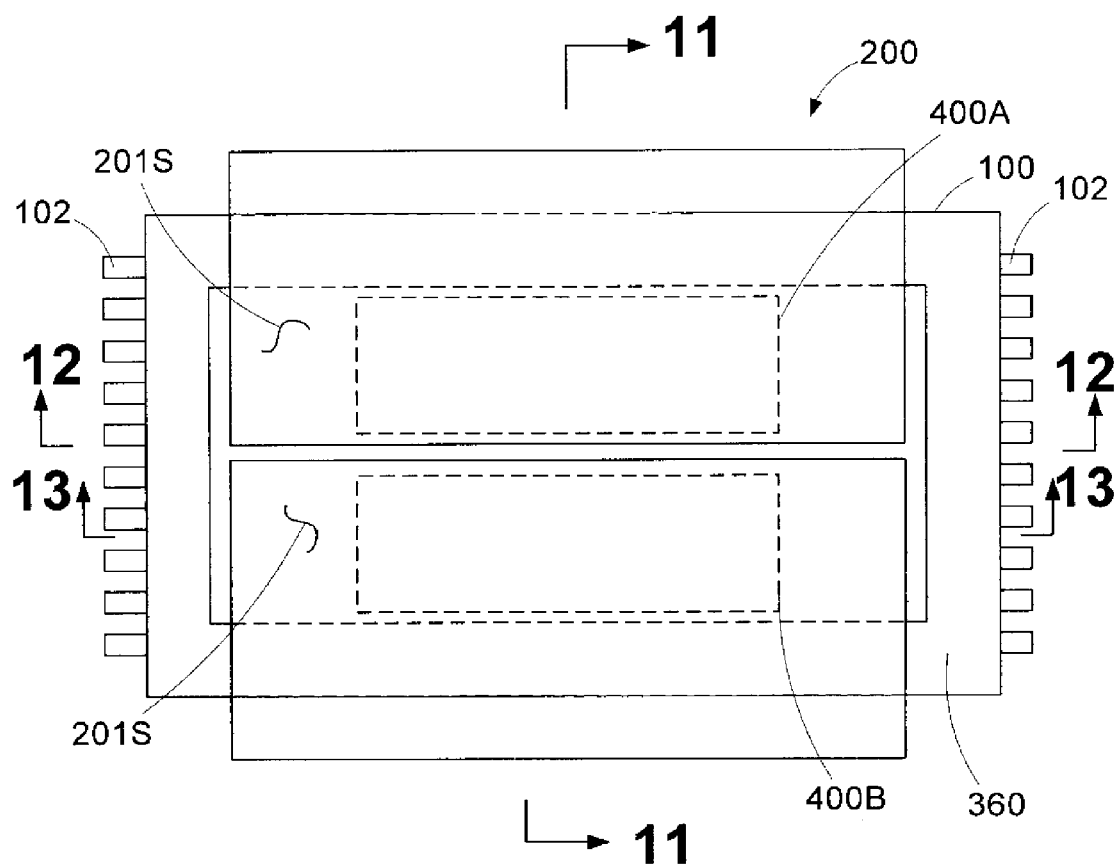
Figure 11:
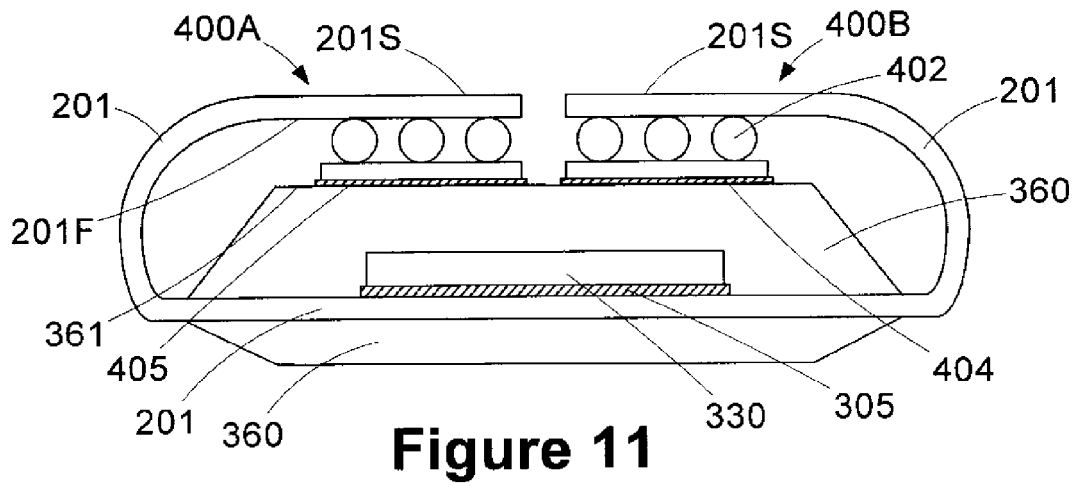

As shown in FIGS. 8-9, one or more additional integrated circuit devices 400A, 400B may be operatively coupled to the flex circuit 200 via the arrays 205A, 205B, respectively. In the depicted example, the integrated circuit devices 400A, 400B comprise a first or top surface 404 and a plurality of conductive balls 402 (see FIG. 9) that are adapted to conductively engage the structures 206 on the flex circuit 200. Techniques for establishing such a conductive connection between the integrated circuit devices 400A, 400B and the flex circuit 200 are well known to those skilled in the art. Thus, the illustrative techniques depicted herein for conductively coupling such components together should not be considered a limitation of the present invention. As with the integrated circuit device 300, the illustrative integrated circuit devices 400A, 400B may be any type of integrated circuit device and they can perform any electrical function. In one particular example, the integrated circuit device 400A and/or 400B may be an application specific integrated circuit or a controller. It should also be understood that terms such as upper, lower and the like are employed in a relative, not absolute sense.

Next, as shown in FIGS. 10-13, the flex circuit 200 is folded such that the first or top surface 404 of the integrated circuit devices 400A, 400B (see FIG. 9) may be positioned proximate or above the other first outer surface 361T of the encapsulant material 360. In this illustrative example, the integrated circuit devices 400A, 400B are positioned in a side-by-side arrangement above the surface 361T of the encapsulant material 360. In an illustrative example, an adhesive material or tape 405 may be employed to secure the integrated circuit devices 400A, 400B to the encapsulant material 360. Again, although two illustrative devices 400A, 400B are depicted in the disclosed embodiment, the subject matter disclosed herein may be employed where only a single integrated circuit device is coupled to a portion of the flex circuit 200 that extends beyond the encapsulant material 360. Moreover, it is not required that the entirety of the integrated circuit devices 400A, 400B be positioned above the surface 361T of the encapsulant material 360. Rather, in some applications, it may be sufficient that something less than the entirety of the integrated circuit devices 400A, 400B may be positioned above the encapsulant material 360.

Figure 14:
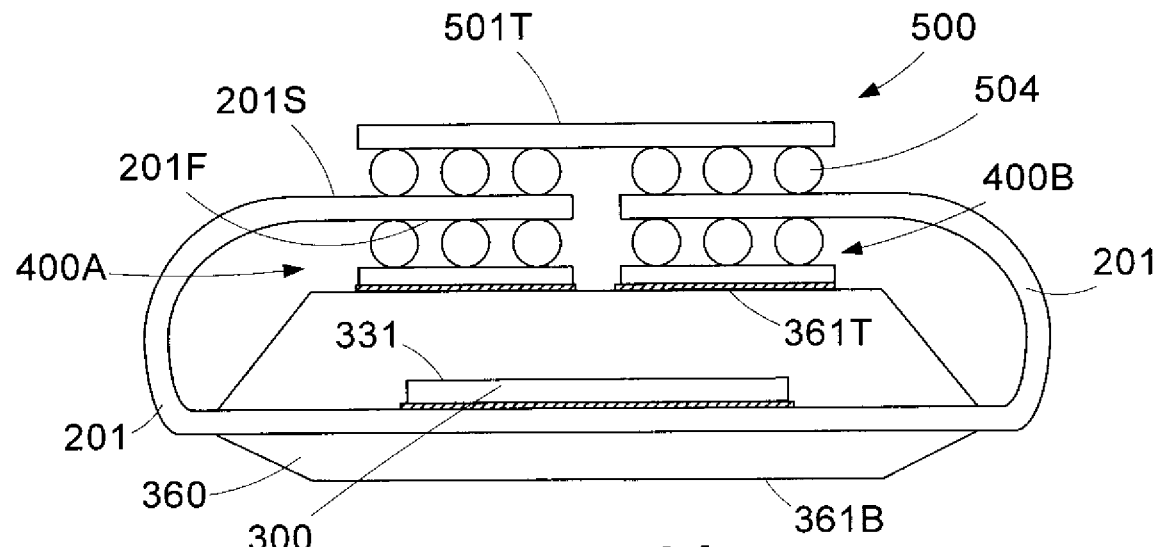
FIGS. 14 and 15 are cross-sectional views depicting other possible stacking arrangements of packaged integrated circuit devices using the techniques disclosed herein.
Figure 15:
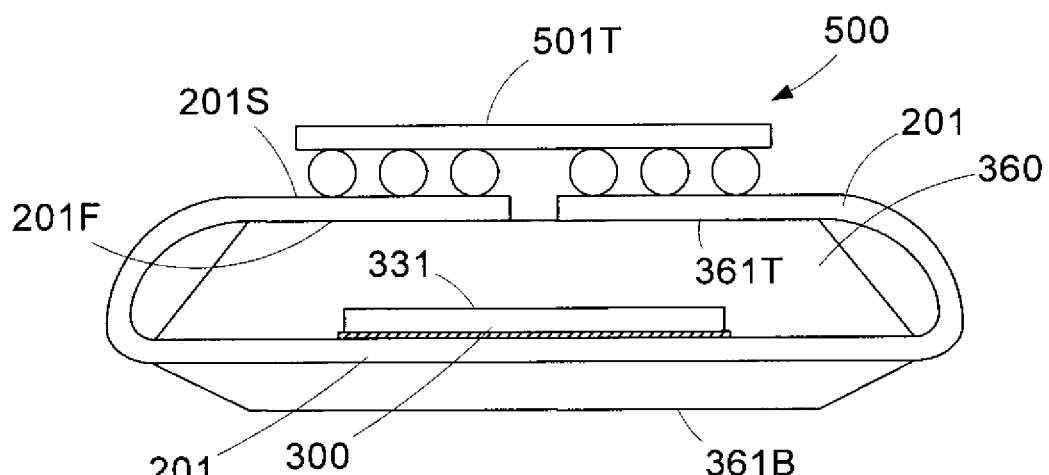

FIGS. 14-15 depict alternative arrangements whereby the structures and techniques disclosed herein may be employed in stacking integrated circuit devices in a variety of different arrangements. For example, as shown in FIG. 14, another illustrative integrated circuit device 500 comprised of a plurality of illustrative conductive connectors 504, e.g., a ball grid array, and a first or top surface 501T may be positioned above and coupled, both electrically and mechanically, to the second surface 201S of the body 201 of the flex circuit 200. The integrated circuit device 500 may be a single device or it may be one or more devices that are separate from one another, like the integrated circuit devices 400A, 400B depicted in FIG. 14 FIG. 15 depicts an illustrative arrangement whereby the surface 201F of the flex circuit 200 may be mechanically coupled to the surface 361T of the encapsulant material 360, and thereafter one or more integrated circuit devices 500 may be mechanically and electrically coupled to the flex circuit 200. As before, the illustrative integrated circuit device 500 is intended to be representative of any type of integrated circuit device.

Figure 16:
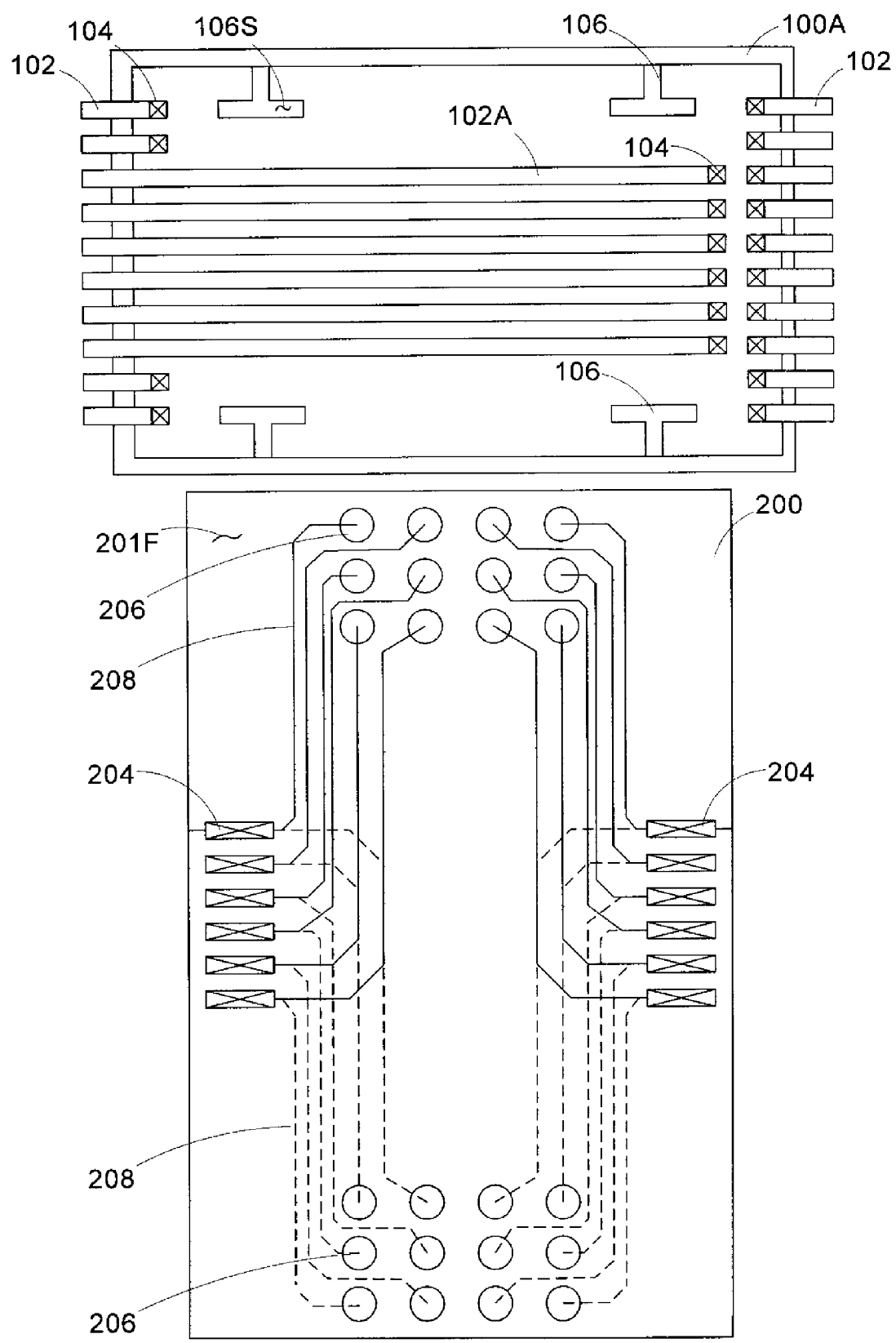
FIGS. 16 and 17 depict another packaged integrated circuit device that includes an illustrative leadframe and flex circuit that may be employed as described herein.
Figure 17:
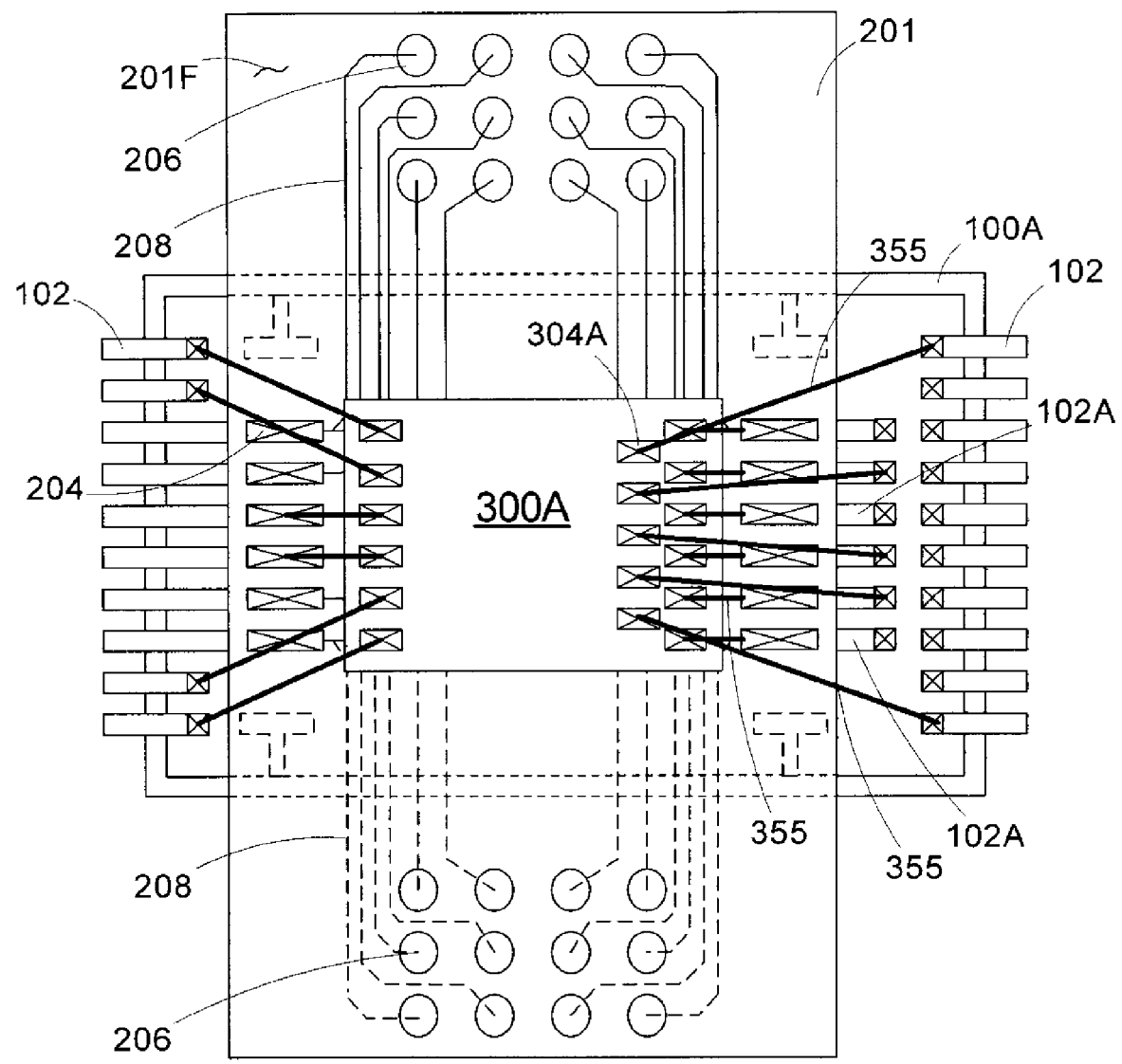

FIGS. 16 and 17 depict another illustrative leadframe 100A that may be employed with a flex circuit 200 as described herein to create a packaged integrated circuit device. As shown in FIG. 16, the leadframe 100A has a plurality of extended lead fingers 102A. In the leadframe 100A depicted in FIG. 16, the bond pads 104 are asymmetrically spaced around the leadframe 100A as compared to the leadframe 100 depicted in FIG. 1. In FIG. 17, the illustrative integrated circuit device 300A has a plurality of bond pads 304A that are also asymmetrically positioned around the integrated circuit device 300A. A plurality of wire bonds 355 are employed to establish the desired electrical connection among the various components. Thus, the techniques disclosed herein may be employed in packaging integrated circuit devices 300A having an asymmetrical pattern of bond pads 304A.

What is claimed:
1. A microelectronic device, comprising:
a leadframe;
a flexible circuit device attached to the leadframe, the flexible circuit device having a first portion corresponding to the leadframe and a second portion extending beyond the leadframe;
a first integrated circuit device attached to the first portion of the flexible circuit device;
an encapsulant covering the first integrated circuit and at least a part of the first portion of the flexible circuit device; and
a second integrated circuit device attached to the second portion of the flexible circuit device and to the encapsulant, wherein:
the leadframe includes a plurality of lead fingers;
the flexible circuit device includes a plurality of bond sites and a plurality of electrical connectors at a first surface, at least some of the bond sites being in electrical connection with some of the electrical connectors;
the flexible circuit device is adhesively attached to the leadframe at a second surface opposite the first surface of the flexible circuit device;
a plurality of wirebonds extending between corresponding lead fingers of the leadframe and the bond sites of the flexible circuit device;
the encapsulant is disposed on the first surface of the flexible circuit device;
at least a part of the second portion of the flexible circuit device is above the encapsulant;
the microelectronic device further includes a plurality of conductive balls coupling a first side of the second integrated circuit device to the second portion of the flexible circuit device; and
an adhesive tape adhesively coupling a second side of the second integrated circuit device to the encapsulant.
2. The microelectronic device of claim 1, wherein the second portion of the flexible circuit device is bent such that the second integrated circuit device is above the encapsulant.
3. The microelectronic device of claim 1, wherein the second portion of the flexible circuit device is bent such that the second portion is facing the first portion and the second integrated circuit device is above the encapsulant.
4. The microelectronic device of claim 1, wherein
the encapsulant at least partially encapsulates the first integrated circuit device, the encapsulant having an outer surface facing away from the first portion of the flexible circuit device; and
the second portion of the flexible circuit device is bent such that the second portion is facing the outer surface of the encapsulant and the second integrated circuit device is adhered to the outer surface of the encapsulant.
5. The microelectronic device of claim 1, wherein
the encapsulant at least partially encapsulates the first integrated circuit device, the encapsulant having an outer surface facing away from the first portion of the flexible circuit device;
the second portion of the flexible circuit device is bent such that the second portion is facing the outer surface of the encapsulant; and
the adhesive tape is between the second integrated circuit device and the outer surface of the encapsulant.
6. A microelectronic device, comprising:
a leadframe having two longitudinal members extending between two transverse members, at least one of the transverse members carrying a plurality of lead fingers;
a flexible circuit device attached to the two longitudinal members of the leadframe, the flexible circuit device having a first portion corresponding to the leadframe and a second portion extending beyond the leadframe, wherein the first portion includes a plurality of bond sites at a first surface and corresponding to the lead fingers, and wherein the second portion includes a plurality of electrical connectors in electrical connection with corresponding bond sites at the first portion; and
an encapsulant covering at least a part of the first portion of the flexible circuit device, wherein:
the flexible circuit device is adhesively attached to the leadframe at a second surface opposite the first surface of the flexible circuit device;
a plurality of wirebonds extending between corresponding lead fingers of the leadframe and the bond sites of the flexible circuit device;
the encapsulant being disposed on the first surface of the flexible circuit device;
at least a part of the second portion of the flexible circuit device is above the encapsulant.
7. The microelectronic device of claim 6, wherein the second portion of the flexible circuit device extends beyond the longitudinal members of the leadframe.
8. The microelectronic device of claim 6, wherein
the second portion of the flexible circuit device extends beyond the longitudinal members of the leadframe in a first direction; and
the flexible circuit device further includes a third portion extending beyond the longitudinal members of the leadframe in a second direction opposite the first direction.

9. The microelectronic device of claim 6, wherein
the second portion of the flexible circuit device extends beyond the longitudinal members of the leadframe in a first direction;
the flexible circuit device further includes a third portion extending beyond the longitudinal members of the leadframe in a second direction opposite the first direction; and
the second and third portions of the flexible circuit device individually include a plurality of electrical connectors.

10. The microelectronic device of claim 6, wherein
the second portion of the flexible circuit device extends beyond the longitudinal members of the leadframe in a first direction;
the flexible circuit device includes a third portion extending beyond the longitudinal members of the leadframe in a second direction opposite the first direction;
the second and third portions of the flexible circuit device individually include a plurality of electrical connectors; and
the flexible circuit device further includes a plurality of traces electrically coupling at least some of the bond sites at the first portion and the electrical connectors at the second and/or third portions.

11. The microelectronic device of claim 6, wherein
the second portion of the flexible circuit device extends beyond the longitudinal members of the leadframe in a first direction;
the flexible circuit device includes a third portion extending beyond the longitudinal members of the leadframe in a second direction opposite the first direction;
the second and third portions of the flexible circuit device individually include a plurality of electrical connectors;
the flexible circuit device further includes a plurality of traces electrically coupling at least some of the bond sites at the first portion and the electrical connectors at the second and/or third portions; and
the microelectronic device further includes a first integrated circuit device attached to the first portion, a second integrated circuit device attached to the second portion, and a third integrated circuit device attached to the third portion.

12. The microelectronic device of claim 6, wherein
the second portion of the flexible circuit device extends beyond the longitudinal members of the leadframe in a first direction;
the flexible circuit device includes a third portion extending beyond the longitudinal members of the leadframe in a second direction opposite the first direction;
the second and third portions of the flexible circuit device individually include a plurality of electrical connectors;
the flexible circuit device further includes a plurality of traces electrically coupling at least some of the bond sites at the first portion and the electrical connectors at the second and/or third portions; and
the microelectronic device further includes a first integrated circuit device attached to the first portion with an adhesive, a second integrated circuit device attached to the second portion with a plurality of conductive balls, and a third integrated circuit device attached to the third portion with another plurality of conductive balls.

13. The microelectronic device of claim 6, wherein
the second portion of the flexible circuit device extends beyond the longitudinal members of the leadframe in a first direction;
the flexible circuit device includes a third portion extending beyond the longitudinal members of the leadframe in a second direction opposite the first direction;
the second and third portions of the flexible circuit device individually include a plurality of electrical connectors;
the flexible circuit device further includes a plurality of traces electrically coupling at least some of the bond sites at the first portion and the electrical connectors at the second and/or third portions;
the microelectronic device further includes
a first integrated circuit device attached to the first portion with an adhesive, a second integrated circuit device attached to the second portion with a plurality of conductive balls, and a third integrated circuit device attached to the third portion with another plurality of conductive balls; and
the second integrated circuit device and the third integrated circuit device are attached to an outer surface of the encapsulant.

14. The microelectronic device of claim 6, wherein
the second portion of the flexible circuit device extends beyond the longitudinal members of the leadframe in a first direction;
the flexible circuit device includes a third portion extending beyond the longitudinal members of the leadframe in a second direction opposite the first direction;
the second and third portions of the flexible circuit device individually include a plurality of electrical connectors;
the flexible circuit device further includes a plurality of traces electrically coupling at least some of the bond sites at the first portion and the electrical connectors at the second and/or third portions;
the microelectronic device further includes
a first integrated circuit device attached to the first portion with an adhesive, a second integrated circuit device attached to the second portion with a plurality of conductive balls, and a third integrated circuit device attached to the third portion with another plurality of conductive balls; and
the second integrated circuit device and the third integrated circuit device are attached to an outer surface of the encapsulant in a side-by-side arrangement.

15. A method for assembling a microelectronic device, comprising:
attaching a flexible circuit device to a leadframe, the flexible circuit device having a first portion corresponding to the leadframe and a second portion extending beyond the leadframe, the flexible circuit device including a plurality of bond sites and a plurality of electrical connectors at a first surface, and the flexible circuit device being adhesively attached to the leadframe at a second surface opposite the first surface, at least some of the bond sites being in electrical connection with some of the electrical connectors;
attaching a first integrated circuit device to the first portion of the flexible circuit device;
forming a plurality of wirebonds between corresponding lead fingers of the leadframe and the bond sites of the flexible circuit device;
covering the first integrated circuit and at least a part of the first portion of the flexible circuit device with an encapsulant, at least a part of the second portion of the flexible circuit device is above the encapsulant; and
attaching a second integrated circuit device to the second portion of the flexible circuit device and to the encapsulant.

16. The method of claim 15 wherein attaching a second integrated circuit device includes:
- attaching the second integrated circuit device to the second portion of the flexible circuit device;
- bending the second portion of the flexible circuit device with the attached second integrated circuit device to position the second integrated circuit device above an outer surface of the encapsulant; and
- attaching the second integrated circuit device to the outer surface of the encapsulant with an adhesive.

17. The method of claim 15 wherein attaching a second integrated circuit device includes:
- attaching a first side of the second integrated circuit device to the second portion of the flexible circuit device with a plurality of conductive balls;
- bending the second portion of the flexible circuit device with the attached second integrated circuit device to position a second side of the second integrated circuit device above an outer surface of the encapsulant, the second side being opposite the first side; and
- attaching the second side of the second integrated circuit device to the outer surface of the encapsulant with an adhesive.

18. The method of claim 15 wherein the flexible circuit device further includes a third portion extending beyond the leadframe, and wherein the method further includes attaching a third integrated circuit device to the third portion of the flexible circuit device and to the encapsulant.

19. The method of claim 15 wherein the flexible circuit device further includes a third portion extending beyond the leadframe, and wherein the method further includes:
- attaching a third integrated circuit device to the third portion of the flexible circuit device;
- bending the second and third portions of the flexible circuit device with the attached second and third integrated circuit devices to position the second and third integrated circuit devices above an outer surface of the encapsulant and generally side-by-side; and
- attaching the second and third integrated circuit devices to the outer surface of the encapsulant with an adhesive.

* * * * *